United States Patent [19]

Looney

[11] 4,354,455
[45] Oct. 19, 1982

[54] APPARATUS FOR OSCILLATING A GAS MANIFOLD IN A ROTARY DISC REACTOR

[75] Inventor: Gary W. Looney, Bordentown, N.J.

[73] Assignee: RCA Corporation, New York, N.Y.

[21] Appl. No.: 234,858

[22] Filed: Feb. 17, 1981

[51] Int. Cl.³ .............................................. C23C 13/08
[52] U.S. Cl. .................................... 118/700; 118/703; 118/705; 118/680; 118/715; 118/730; 74/42
[58] Field of Search ................ 118/715, 726, 727, 729, 118/730, 323, 700–703, 705, 706, 680, 698, 679, 681, 682; 74/42

[56] References Cited

U.S. PATENT DOCUMENTS

| 1,831,535 | 11/1931 | Tuers | 118/323 |
| 2,984,177 | 5/1961 | Cronquist | 74/586 X |
| 3,274,860 | 9/1966 | Gauthier et al. | 118/323 X |
| 4,062,318 | 12/1977 | Ban et al. | 118/725 |

FOREIGN PATENT DOCUMENTS 2728244  1/1979  Fed. Rep. of Germany ...... 118/323

Primary Examiner—John D. Smith
Assistant Examiner—Bernard F. Plantz
Attorney, Agent, or Firm—Birgit E. Morris; Donald S. Cohen; Joseph D. Lazar

[57] ABSTRACT

A variable sweep means connects the rotating shaft of an electric motor to a rotatable gas manifold in a rotary disc reactor to convert rotation of the shaft into reciprocating oscillation of the gas manifold. A cycle timing control means for varying electric motor speed at two independent speeds is connected to the electric motor. The control means varies the oscillation speed of the gas manifold at two sweep rates by varying electric motor speed automatically during each sweep cycle.

13 Claims, 3 Drawing Figures

APPARATUS FOR OSCILLATING A GAS MANIFOLD IN A ROTARY DISC REACTOR

BACKGROUND OF THE INVENTION

This invention pertains to rotary disc reactors in which a stack of semiconductor wafers is subjected to chemical vapor deposition of material for epitaxial growth on the wafers. More particularly, this invention pertains to oscillation of a rotatable gas manifold which is used in such rotary disc reactors to sweep a stream of gas across the semiconductor wafers in order to equalize epitaxial growth across the surfaces of the semiconductor wafers.

U.S. Pat. No. 4,062,318 to Ban et al. discloses apparatus for use in chemical vapor deposition (CVD) in a rotary disc reactor. As is there set forth, it has been found that if the gas manifold and the semiconductor wafers are held fixed with respect to each other, the epitaxial layer which is grown on the wafer substrate will be non-uniform in thickness and will be thickest at the central region of the wafer. This patent teaches that more uniform growth of an epitaxial layer may be achieved by oscillating the gas manifold back and forth to sweep a stream of gas across the surface of each semiconductor wafer. This patent also teaches that it is advantageous to increase sweep speed when the stream of gas is swept across the central regions of the semiconductor wafers and to decrease sweep speed when the gas is swept across the peripheral regions of the semiconductor wafers. Since the central regions of the semiconductor wafers are always swept for less time than are the peripheral regions of the semiconductor wafers, excessive growth rates of the epitaxial layer at the central regions of the semiconductor wafers are reduced if not eliminated.

In order to achieve such time-controlled sweep, an electric motor has been connected directly to the gas manifold, the electric motor being controlled by a programmable instrument. Such apparatus has been found to be expensive, bulky, and difficult to program. There is a need for a compact, inexpensive and more easily programmed system for oscillating a gas manifold at a predetermined sweep rate in a rotary disc reactor.

SUMMARY OF THE INVENTION

The rotating shaft of an electric motor is connected to the gas manifold of the rotaryy disc reactor by a variable sweep means. The variable sweep means converts rotation of the shaft into reciprocating oscillation of the gas manifold between two extrema. A control means for varying electric motor speed is connected to the electric motor, to vary oscillation speed of the gas manifold within a single sweep between its two extrema.

DETAILED DESCRIPTION OF A PREFERRED EMBODIMENT

Figure 1:
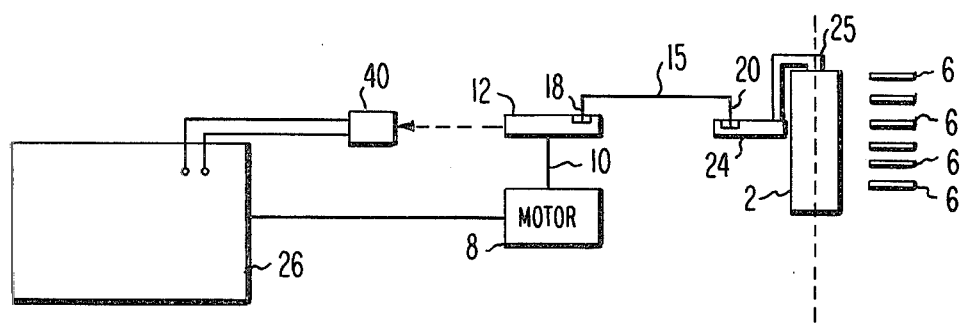
FIG. 1 is a schematic block diagram of an embodiment of the invention.

In FIG. 1, a gas manifold 2 is shown rotatably mounted to rotate about a vertical axis of rotation 4 within a rotary disc reactor (not otherwise shown but of the type described in the above-mentioned Ban, et al. patent). Gas manifold 2 directs streams of gas, such as silane, over the surfaces of a plurality of semiconductor wafers 6, which are placed one above the other to form a vertical stack within the rotary disc reactor. For construction details of gas manifold 2, the rotary disc reactor, and the susceptors (not shown) which support semiconductor wafers 6, and for details of the gas distributed by gas manifold 2, reference may be made to U.S. Pat. No. 4,062,318 to Ban, et al.

An electric motor 8 has a shaft 10 which is rotated about an axis parallel to axis of rotation 4 and is rigidly connected to the center of a circular plate 12. Plate 12 is shown in plan view in FIG. 2. Plate 12 is perpendicular to shaft 10, is 4½ inches in diameter, and rotates clockwise (arrow 12a) as viewed in FIG. 2. Plate 12 has a plurality of holes 14 extending radially outwardly from shaft 10 in a straight line.

A variable sweep means is provided to convert rotation of the shaft 10 into a reciprocating oscillation of the gas manifold 2. The sweep means is formed of a generally circular plate 12, a rod 15, and an elongated plate 24.

The rod 15 has a first end pin 18 which engages any one of holes 14 on plate 12, and is shown engaged with the outermost one of holes 14. Rod 15 is length adjustable as by has two telescopic pieces 16 and 17. One such piece 16 is threaded into the other such piece 17 as to make the length of rod 15 adjustable for reasons set forth below.

Rod 15 also has a second end pin 20 which can be engaged in any single one of a plurality of holes 22 located in the lever sweep arm 24. Lever arm 24 is suitably 6 inches long, and is secured to gas manifold 2 by a bracket 25 to cause gas manifold 2 to pivot about the axis of manifold rotation 4. A plurality of holes 22 in lever arm 24 extend radially outwardly from axis of rotation 4 in a straight line.

Figure 3:
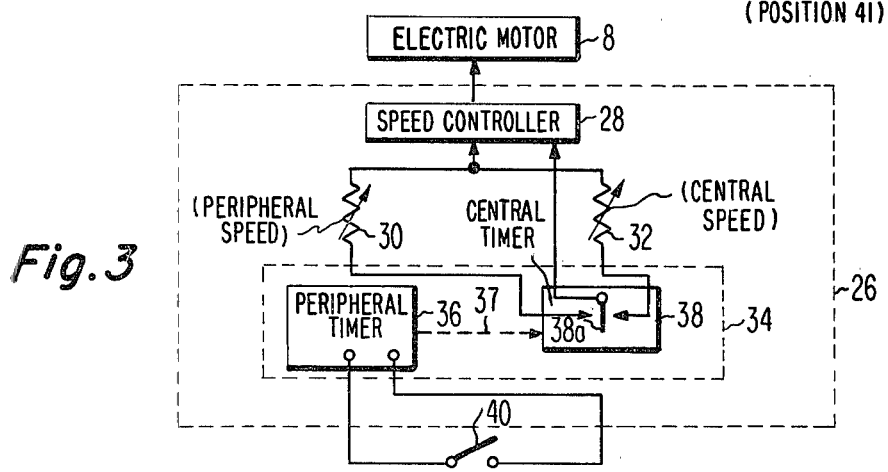
FIG. 3 is a block diagram of the control means for varying the speed of the electric motor shown in FIG. 1.

A control means 26 for varying speed of electric motor 8 includes a silicon controlled rectifier (SCR) type speed controller 28 (see FIG. 3). Speed controller 28 is a conventional controller arranged to provide a d.c. voltage from a rectifier such as a silicon controller rectifier (SCR), to the d.c. motor (8) whose speed is a function of the amplitude of d.c. voltage. A potentiometer (32 or 30 to be described) is adjusted to provide the desired motor speed by varying the voltage output from the rectifier. A suitable speed controller for practicing the invention is manufactured by B & B Motors and Control Corporation N.Y., N.Y., as Model No. SCR 05. In the commercially available version of this controller, one potentiometer is provided. The Model SCR 05 device is modified for the purposes of this invention to have two control potentiometers 30 and 32 as shown in FIG. 3. The potentiometers 30 and 32 are suitably 100 KΩ, 10 turn, Burns-type potentiometers.

Control means 26 further includes a time delay relay 34 which is commercially available under the designation of TDI-A-80 S from the High-G Co. Inc., Windsor Locks, Conn. Time delay relay 34 includes two variable timers, to serve as a peripheral timer 36 and a central timer 38 which provide two preselected time periods of different duration in sequence for each cycle. Time delay relay 34 moreover includes a single pole double throw switch 38a which is normally closed as indicated in FIG. 3. Peripheral timer 36 is operated upon the closure of switch 40. Timer 36 merely provides a time period during which motor 8 is driven via controller 28 at the speed determined by adjustment of peripheral speed potentiometer 30. This time period together with the speed of motor 8 defines the sweep portion 6P diametrically over wafer 6. Potentiometer 30 is normally connected to controller 28 while switch 38a is normally closed. At the end of the predetermined time for the operation of timer 36 an electrical signal via path 37 is applied to the adjustable timer 38. Timer 38 is adjusted for the time duration desired for controlling the sweep over the central portion 6C of wafer 6.

Upon the starting of timer 38, switch 38a is operated from the normally closed position to the closed position on the right as shown in FIG. 3 to couple potentiometer 32 into the speed controller 28 and disconnecting potentiometer 30. When timer 38 has been operated for its predetermined time period, switch 38a is released back to its normally closed position connecting potentiometer 30 back into the circuit for controlling speed controller 38 and for removing from the controller circuit 28 potentiometer 32. Potentiometer 30 in circuit changes the speed of controller 28 and thus motor 8 to the original peripheral speed. The sweep of the nozzle is then continued for the peripheral portion 6P. By this time, disc 12 has been rotated 180° so that tooth 41 is in position to operate switch 40 to start timer 36.

Thus, time delay relay 34 functions to operate motor 8 at two predetermined time periods. Moreover, the system as illustrated in FIG. 3 is self-synchronizing so that it will within a half of the rotation of disc 12 automatically synchronize itself into two peripheral speeds portion and central speed portion of operation, as will be further explained hereinafter.

Microswitch 40 is opened and closed by two diametrically opposed teeth 41 and 42 which are located on the periphery of plate 12 and extend radially outwardly therefrom. Plate 12 is oriented such that teeth 41 and 42 are in a position to correspond respectively to the two extrema positions of rotation of the manifold 2. Each of teeth 41 and 42 closes microswitch 40 when gas manifold 2 is rotated to a corresponding extremum in its oscillation, i.e. reaches its leftmost or rightmost position as viewed in FIG. 2.

Figure 2:
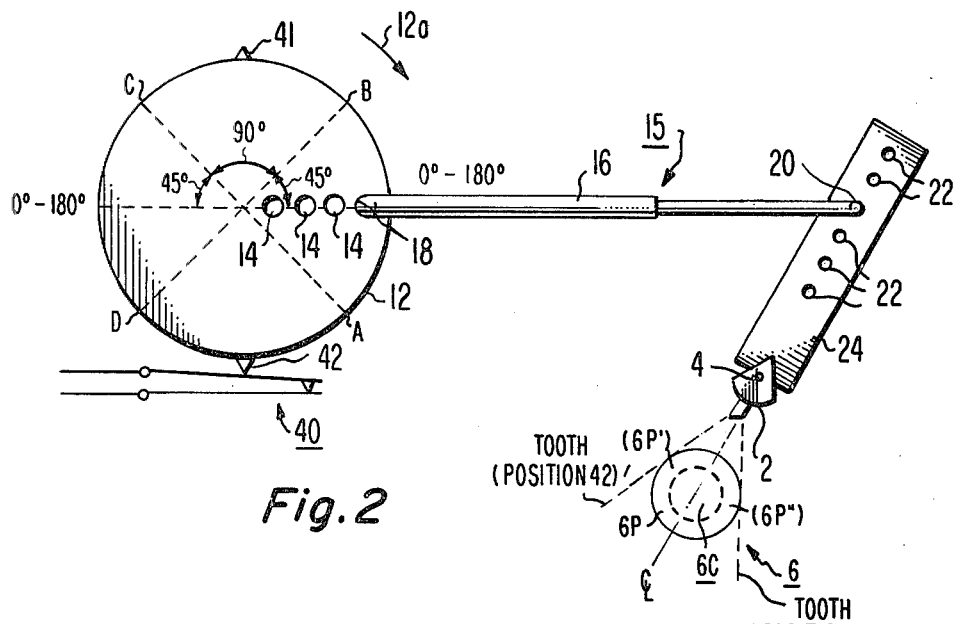
FIG. 2 is a top view of the variable sweep means used in the embodiment of the invention.

When electric motor 8 rotates shaft 10 and thus rotates plate 12, rod 15 will move back and forth from left to right as viewed in FIG. 2, thus converting rotation of shaft 10 into reciprocating oscillation of gas manifold 2 about the axis of rotation 4. Each full rotation of plate 12 will cause two full sweeps of gas manifold 2 to take place. One full rotation of plate 12 will thus cause gas manifold 2 to oscillate from its leftmost extremum to its rightmost extremum and back again.

It is advantageous to utilize an oscillation amplitude of 60° for gas manifold 2 in a CVD process for, for example 2¼ inch semiconductor wafers 6. Such an oscillation amplitude can be achieved by placing first end pin 18 in one of holes 14, placing second end pin 20 into one of holes 22, and adjusting the length of connecting link 15 as needed. If the oscillation amplitude of gas manifold 2 is to be other than 60 degrees, such a change variation can be accomplished by suitably repositioning the first and second end pins 18 and 20 and readjusting the length of rod 15.

Initially, the variable sweep means shown in FIG. 2 is adjusted to provide a 60° oscillation of gas manifold 2. Next, potentiometers 30 and 32 are adjusted to provide the desired oscillation speeds for gas manifold 2, at peripheral region 6P and central region 6C of the wafer 6, respectively. Furthermore, the sweep means is adjusted so that at its starting point, gas manifold 2 will be at an extremum in its oscillation and microswitch 40 will be closed by one of teeth 41 and 42. (In FIG. 2, microswitch 40 is shown to be closed by tooth 42.) This will cause time delay relay 34 to be started by starting peripheral timer 36, which in turn will allow speed controller 28 to control the speed of electric motor 8 in accordance with the preselected resistance value of potentiometer 30. Peripheral timer 36 is adjusted to operate for that period of time which corresponds to 45° of rotation of plate 12.

After plate 12 has rotated 45°, e.g. through a distance such as position A to position B, time delay relay 34 will inactivate peripheral timer 36 and will activate central timer 38. Activation of central timer 38 will cause speed controller 28 to control the speed of motor 8 in accordance with the preselected resistance of potentiometer 32. Central timer 38 is then adjusted to be operated for 90° of rotation of plate 12, e.g. through a distance such as position B to position D. After such rotation has taken place, time delay relay 34 will automatically deactivate central timer 38 and will reactivate peripheral timer 36.

During the next 45° of rotation of plate 12, i.e. through a distance from position D to A, the speed of motor 8 will be controlled by speed controller 28 in accordance with the resistance of potentiometer 30. At the end of this 45° of rotation of plate 12, tooth 41 will close microswitch 40, starting time delay relay 34 to begin another cycle with activation of peripheral timer 36. Hence, during each 180° of rotation of plate 12, the first 45° of rotation will be controlled in accordance with the resistance of potentiometer 30, the next 90° will be controlled in accordance with the resistance of potentiometer 32, and the last 45° will be controlled in accordance with the resistance of potentiometer 30. Oscillation speed of gas manifold 2 when a stream of gas is directed over each central region 6C is controlled by the setting of potentiometer 32, while oscillation speed of gas manifold 2 adjacent each peripheral region 6P is controlled by the setting of potentiometer 30. Thus, oscillation speed can be increased and decreased within a single sweep of gas manifold 2 between its two extrema in order to make epitaxial growth upon semiconductor wafer 6 uniform. The point of crossover between faster and slower oscillation speeds of gas manifold 2 (i.e. the boundary between peripheral region 6P and central region 6C of each semiconductor wafer 6) can be adjusted by readjusting the settings of peripheral timer 36 and central timer 38. The respective oscillation speeds, it will be recognized, are automatically synchronized within one half of a rotation of disc 12, that is, the distance between each of the diametrically opposed teeth 41 and 42.

In operation, speed controller is energized by a suitable on-off control switch (not shown) which causes the motor to rotate in either of two preselected directions of rotation. As shown, motor 8 drives plate 12 in a clockwise direction as seen in FIG. 2. Switch 38a in the normally closed position places potentiometer 30 in the circuit to drive motor 8 at the predetermined peripheral speed determined by the value of the potentiometer 30. The manifold 2 will be swept over the surface of wafer 6 until either one of teeth 41 or 42 is in position to operate switch 40. As shown in FIG. 2, the extreme position of sweep will be adjusted so that tooth 42 corresponds to the left extremum and tooth 41 is on the right extremum of the sweep. Assuming that the tooth 42 is in position to operate switch 40, timer 36 will then be energized to a time period corresponding to the peripheral portion 6P'. The distance for the radial portion 6P' is determined by the speed of motor 8 as well as the time of operation of timer 36. Timer 36 at the end of the period for peripheral portions 6P' will then energize timer 38 to thereby operate switch 34a to connect potentiometer 32 into the control circuit 28. Control 28 then operates motor 8 at the predetermined speed for the central portion according to the value of potentiometer 32. The operation then continues as described hereinabove to drive the manifold 2 across the central portion 6C until the peripheral portion 6P" is to be swept at the speed determined by the potentiometer 30 placed in the circuit by the switch 38a being returned to its normally closed position.

The apparatus of the invention provides a means for oscillating a gas manifold in a rotary disc reactor in two independent and symmetrical sweep rates. The sweep can be arranged to be faster through the center portion of the wafer 6 (see 6C) than in the peripheral portion (6P') then decreasing to the original sweep rate in the opposite peripheral portion (6P") at the opposite edge of the wafer before starting the cycle again. Various sized wafers and different sweep rates can be provided with the apparatus of the invention. Thus, to change the sweep angle any one or more adjustments can be made in the length of rod 15, in the position of pin 18 or in the position of pin 20. The speed of the sweep at the peripheral portion is changed by adjustment of the potentiometer 30 and at the central portion by potentiometer 32. Moreover, the dwell time at the central portion and the peripheral portion is predetermined by adjustment of the central timer 38 and the peripheral timer 36, respectively.

What is claimed is:

1. An apparatus for oscillating a rotatable gas manifold in sweeps between two extrema within a rotary disc reactor, comprising:
    an electric motor having a rotating shaft;
    variable sweep means connecting the shaft to the gas manifold, for converting rotation of the shaft into reciprocating oscillation of the gas manifold between two extrema; and
    a control means for varying electric motor speed, whereby oscillation speed of the gas manifold within a single sweep between its two extrema may be varied;
    said sweep means further including:
    a circular plate attached to the motor shaft and rotating therewith, the plate being perpendicular to the shaft and having at least one hole and two teeth projecting radially outwardly from the shaft;
    a connecting rod with a first end pin and a second end pin, the first end pin being engagable with a single one of said at least one hole in the plate; and
    a lever arm connected to the gas manifold and rotating therewith, the lever arm having at least one hole, the second end pin of the connecting rod being engagable with a single one of said at least one hole in the lever arm;
    said control means further including a fixed switch which is actuated by said teeth on said plate.

2. The apparatus defined by claim 1, wherein there are a plurality of holes in the plate extending radially outwardly from the shaft, and wherein there are a plurality of holes in the lever arm extending radially outwardly from an axis of rotation of the gas manifold.

3. The apparatus defined by claim 1, wherein the connecting link has an adjustable length.

4. The apparatus defined by claim 1, wherein said control means includes a time delay relay which is synchronized with plate rotation by opening and closure of the switch.

5. The apparatus defined by claim 1, wherein the two teeth are diametrically opposed to each other and are positioned to actuate the switch when the gas manifold is at an oscillation extremum.

6. The apparatus defined by claim 5, wherein the time delay relay includes two variable timers which are alternately operated in a cycle that is initiated by operation of the switch.

7. In combination with a rotary disc reactor which includes a gas manifold, which is oscillatory in sweeps between two extrema, the improvement comprising:
    an electric motor having a rotating shaft;
    a variable sweep means connecting the shaft of the gas manifold converting rotation of the shaft into reciprocating oscillation of the gas manifold between two extrema; and
    a control means for varying electric motor speed, whereby oscillation speed of the gas manifold within a single sweep between its two extrema may be varied;
    said sweep means further including:
    a circular plate attached to the motor shaft and rotating therewith, the plate being perpendicular to the shaft and having at least one hole and two teeth projecting radially outwardly from the shaft;
    a connecting rod with a first end pin and a second end pin, the first end pin being engagable with a single one of said at least one hole in the plate; and
    a lever arm connected to the gas manifold and rotating therewith, the lever arm having at least one hole, the second end pin of the connecting rod being engagable with a single one of said at least one hole in the lever arm;
    said control means further including a fixed switch which is actuated by said teeth on said plate.

8. The combination defined by claim 7, wherein there are a plurality of holes in the plate extending radially outwardly from the shaft, and wherein there are a plurality of holes in the lever arm extending radially outwardly from an axis of rotation of the gas manifold.

9. The combination defined by claim 7, wherein the connecting link has an adjustable length.

10. The combination defined by claim 7, wherein the two teeth are diametrically opposed to each other and are positioned to actuate the switch when the gas manifold is at an oscillation extremum.

11. The combination defined by claim 7, wherein said control means includes a time delay relay which is synchronized with plate rotation by opening and closure of the switch.

12. The combination defined by claim 11, wherein the time delay relay includes two variable timers which are alternately operated in a cycle that is initiated by operation of the switch.

13. The combination recited in claims 1 or 7 wherein said sweep means further includes means to sense the oscillation extrema to synchronize the control means to each manifold sweep.

* * * * *